( 12 ) United States Patent
Miller

(10) Patent No.: US 9,691,941 B2
(45) Date of Patent: Jun. 27, 2017

(54) BARRIERS, INJECTORS, TUNNEL-JUNCTIONS, AND CASCADED LED JUNCTIONS

(71) Applicant: TERAHERTZ DEVICE CORPORATION, Salt Lake City, UT (US)

(72) Inventor: Mark S. Miller, Salt Lake City, UT (US)

(73) Assignee: Terahertz Device Corporation, Salt Lake City, UT (US)

( * ) Notice: Subject to any disclaimer, the term of this patent is extended or adjusted under 35 U.S.C. 154(b) by 0 days.

(21) Appl. No.: 15/103,161

(22) PCT Filed: Dec. 12, 2014

(86) PCT No.: PCT/US2014/070062
§ 371 (c)(1),
(2) Date: Jun. 9, 2016

(87) PCT Pub. No.: WO2015/089423
PCT Pub. Date: Jun. 18, 2015

(65) Prior Publication Data
US 2016/0308093 A1    Oct. 20, 2016

Related U.S. Application Data

(60) Provisional application No. 61/915,402, filed on Dec. 12, 2013.

(51) Int. Cl.
*H01L 33/14* (2010.01)
*H01L 33/06* (2010.01)
(Continued)

(52) U.S. Cl.
CPC ...... *H01L 33/14* (2013.01); *H01L 31/035236* (2013.01); *H01L 31/0735* (2013.01); *H01L 31/167* (2013.01); *H01L 33/0025* (2013.01); *H01L 33/06* (2013.01); *H01L 33/145* (2013.01); *H01L 33/30* (2013.01)

(58) Field of Classification Search
CPC ............. H01L 33/14; H01L 31/035236; H01L 33/145; H01L 31/167; H01L 33/0025; H01L 31/0735; H01L 33/06; H01L 33/30
See application file for complete search history.

(56) References Cited

U.S. PATENT DOCUMENTS 4,974,044 A    11/1990 Cunningham et al.
5,995,529 A    11/1999 Kurtz et al.
(Continued)

OTHER PUBLICATIONS

International Search Report and Written Opinion for PCT Application PCT/US2014/70062, mailed Mar. 18, 2015.

*Primary Examiner* — David Vu
(74) *Attorney, Agent, or Firm* — Ray Quinney & Nebeker, P.C.; Paul N. Taylor

(57) ABSTRACT

Optoelectric devices that comprise a semiconductor superlattice heterostructure. One or more individual layers within the semiconductor superlattice heterostructure can further comprise layers of differing thicknesses. In at least one embodiment, an optoelectric device with specially engineered layers can generate an output wavelength of between 3 μm to 15 μm at output power levels of 0.01 mW to 100 mW.

20 Claims, 12 Drawing Sheets

(51) Int. Cl.
H01L 33/30 (2010.01)
H01L 31/0352 (2006.01)
H01L 31/0735 (2012.01)
H01L 31/167 (2006.01)
H01L 33/00 (2010.01)

(56) References Cited

U.S. PATENT DOCUMENTS

| | | | | |
|---|---|---|---|---|
| 6,404,791 B1* | 6/2002 | Yang | ............... | B82Y 20/00 |
| | | | | 372/45.01 |
| 7,737,411 B2* | 6/2010 | Gunapala | ............ | B82Y 20/00 |
| | | | | 250/370.01 |
| 2002/0027238 A1 | 3/2002 | Lin et al. | | |

* cited by examiner

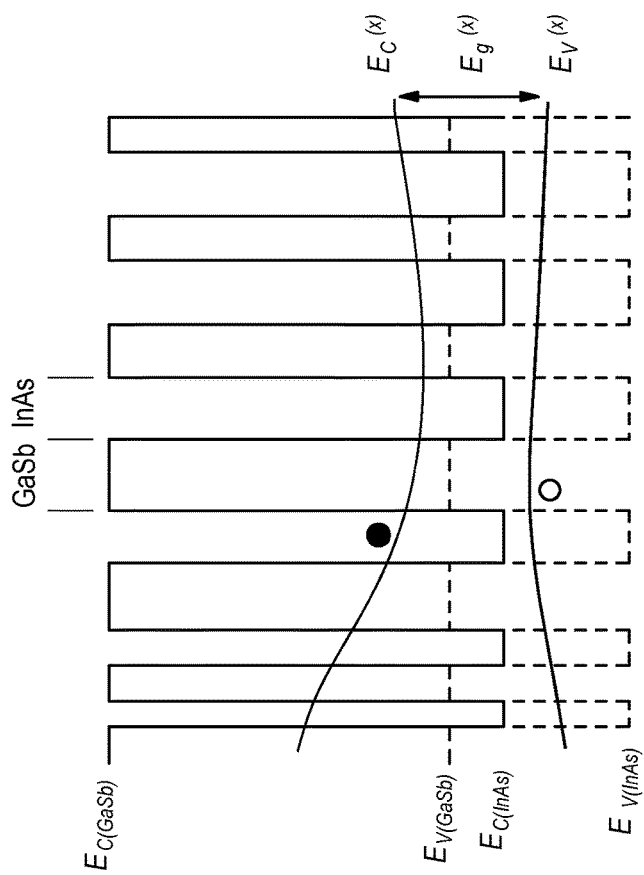
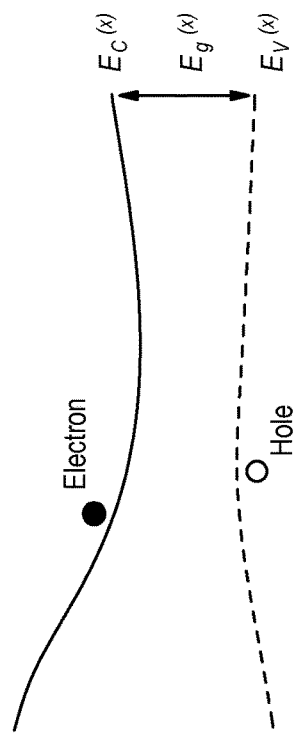
FIG. 4A
FIG. 4B

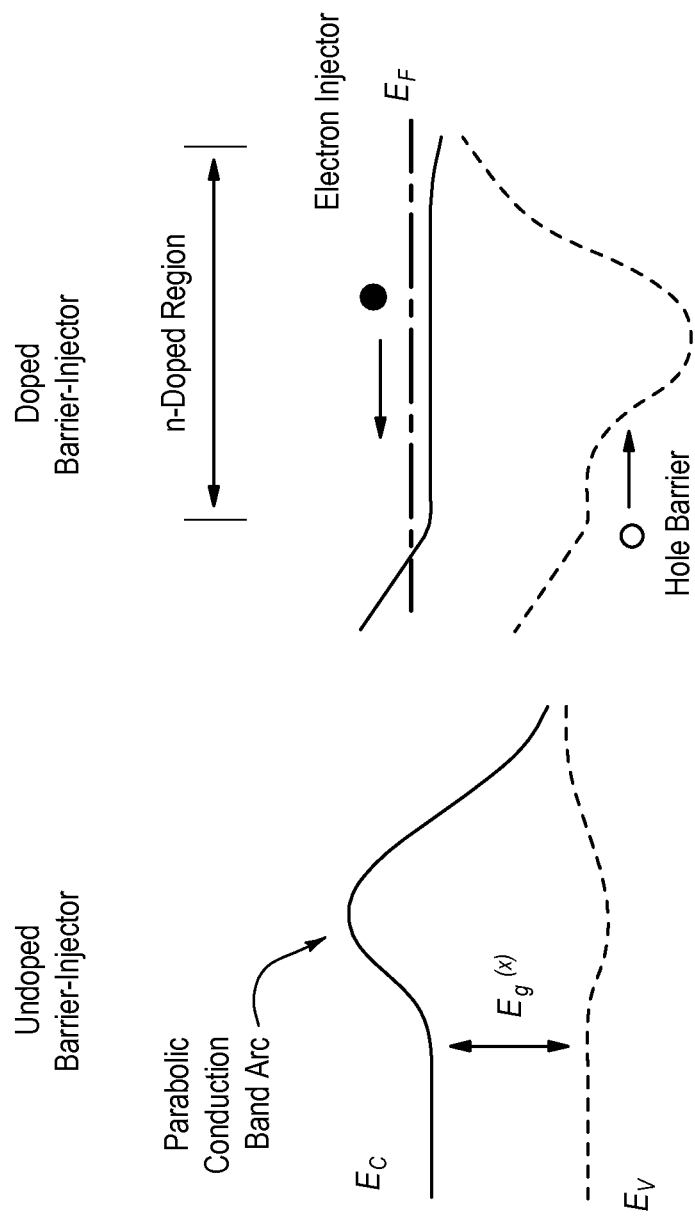

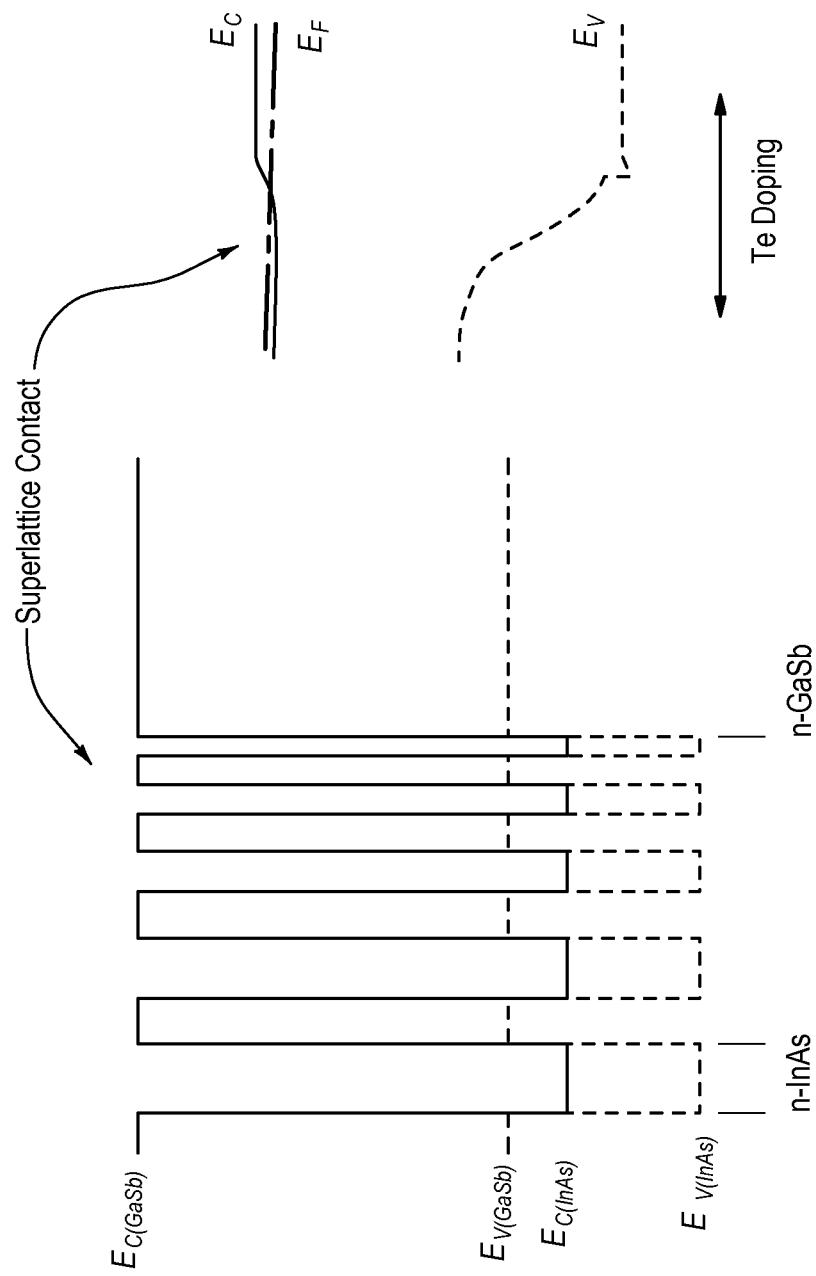

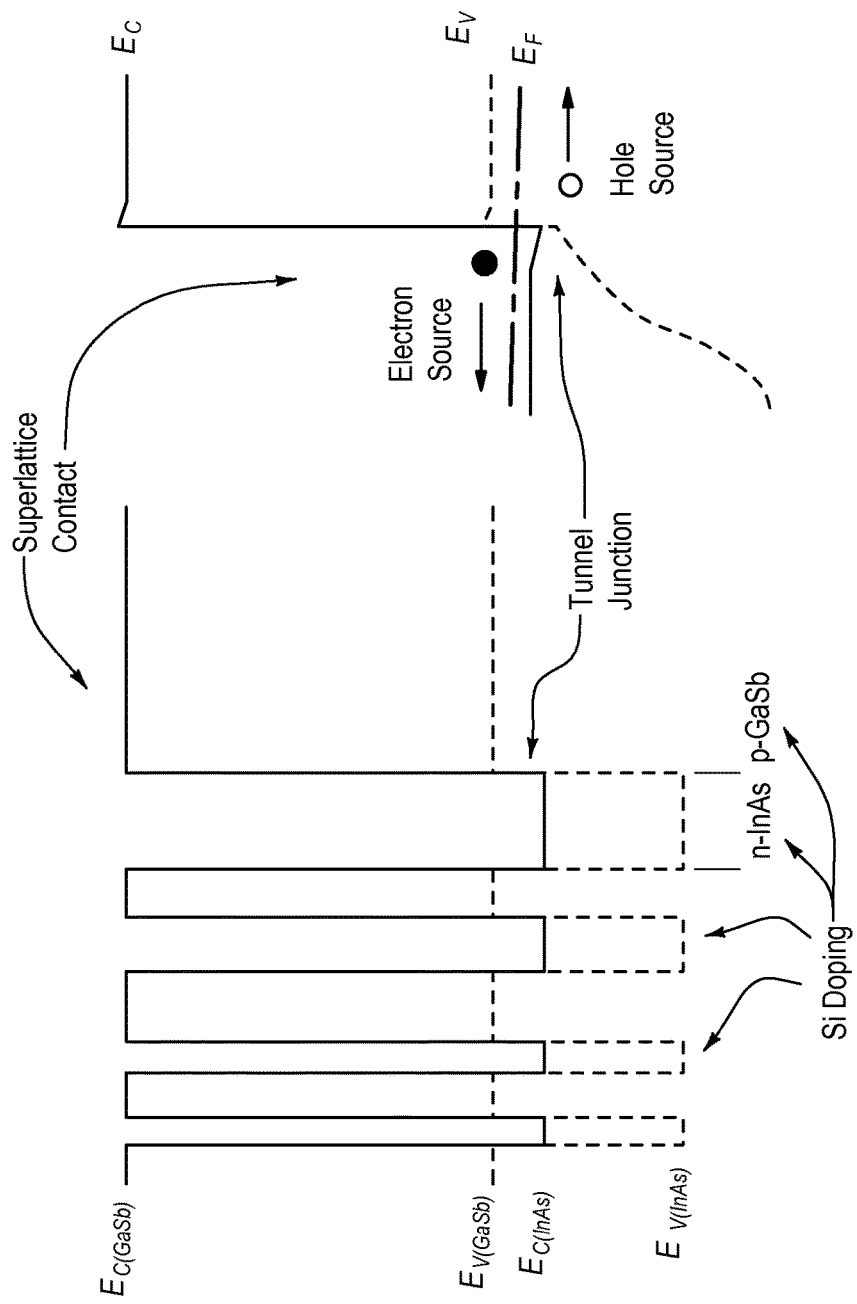

BARRIERS, INJECTORS, TUNNEL-JUNCTIONS, AND CASCADED LED JUNCTIONS

CROSS REFERENCE TO RELATED APPLICATIONS

This application is a U.S. Nationalization of PCT Application Number PCT/US2014/070062, filed on Dec. 12, 2014, which claims priority to U.S. Provisional Application No. 61/915,402 entitled "BARRIERS, INJECTORS, TUNNEL JUNCTION CONTACTS, AND CASCADED LED JUNCTIONS," filed Dec. 12, 2013, which are herein incorporated by reference in their entireties.

BACKGROUND

The use of doped semiconductors to create barriers, injectors, tunnel junction contacts, cascade LED junction, and other related devices has long been known in the art. Specially, conventional semiconductor materials can be comprised of doped semiconductor layers placed into contact with each other to create one or more p-n junctions. In the case of light emitting diodes (LEDs), as electrical current is applied to the junctions, electrons and holes combine with each other and emit photons. The energy contained in the emitted photos corresponds to the energy difference between the respective holes and electrons. Manipulating the energy gap within the p-n junction can allow for the creation of particular wavelengths and energy levels of emitted light.

BRIEF SUMMARY

Embodiments of the present invention comprise systems, methods, and apparatus configured to increase the performance of optical electric devices. In particular, embodiments of the present invention comprise structures that implement superlattice heterostructures within semiconductor optoelectronic devices. At least one embodiment comprises superlattice heterostructures in which the local material curvature of the majority carrier energy band edge is kept sufficiently small compared to the local electrostatic doping curvature, such that an adequate local majority carrier concentration is maintained for low-resistance electrical conduction. Embodiments of the present invention provide significant benefits in various applications, including improved mid-wave infrared ("MWIR") and long-wave infrared ("LWIR") LED performance.

Some embodiments may include optoelectric devices that comprise a semiconductor superlattice heterostructure. One or more individual layers within the semiconductor superlattice heterostructure can further comprise layers of differing thicknesses. In at least one embodiment, an optoelectric device with specially engineered layers can generate an output wavelength of between 3 μm to 15 μm at output power levels of 0.01 mW to 100 mW.

An additional embodiment may comprise a method of manufacturing semiconductor superlattice heterostructures. In particular, the method may comprise creating a semiconductor superlattice heterostructure by alternating layers of semiconducting crystals. Each layer within the semiconductor superlattice heterostructure may comprise a thickness of between 1 to 10 nm. Additionally, the thickness of each of the layers of semiconducting crystal can comprise a variable, graded period, such that one or more of the alternating layers comprise a different thickness. Further, the method can comprise configuring the semiconductor superlattice heterostructure to simultaneously remove energy barriers to majority carrier flow while imposing a bather to minority carrier flow by varying the layer period and a majority carrier doping level.

Additionally, an embodiment of the present invention may include an optoelectric device that comprises a semiconductor superlattice heterostructure. One or more individual layers within the semiconductor superlattice heterostructure may further comprise layers of differing thicknesses. Additionally, the optoelectric device may comprise hole injectors that connect a valence band edge of a tunneling contact via a p-type GaSb layer for majority hole carriers to light emitting superlattice layers while providing a minority electron blocking barrier. Further, the optoelectric device may comprise electron injectors that connect a conduction band edge of a tunneling contact for majority electron carriers to the light emitting superlattice layers while providing a minority hole blocking layer. In at least one embodiment, the optoelectric device is configured to construct majority carrier injectors and minority carrier barriers for mid-infrared LEDs using InAs and GaAs and related compounds for superlattices for light emission.

Additional features and advantages of exemplary embodiments of the invention will be set forth in the description which follows, and in part will be obvious from the description, or may be learned by the practice of such exemplary embodiments. The features and advantages of such embodiments may be realized and obtained by means of the instruments and combinations particularly pointed out in the appended claims. These and other features will become more fully apparent from the following description and appended claims, or may be learned by the practice of such exemplary embodiments as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof, which are illustrated in the appended drawings. Understanding that these drawings depict only typical embodiments of the invention and are not therefore to be to considered to be limiting of its scope, the invention will be described and explained with additional specificity and detail through the use of the accompanying drawings in which:

FIG. 4A illustrates another band diagram of electron potential energy versus position through superlattice layers in accordance with embodiments of the present invention;

FIG. 4B illustrates another band diagram of electron potential energy versus position through superlattice layers in accordance with embodiments of the present invention;

FIG. 6A illustrates an undoped barrier-injector band diagram of electron potential energy versus position through superlattice layers in accordance with embodiments of the present invention;

FIG. 6B illustrates a doped barrier-injector band diagram of electron potential energy versus position through superlattice layers in accordance with embodiments of the present invention;

FIG. 7A illustrates another band diagram of electron potential energy versus position through superlattice layers in accordance with embodiments of the present invention;

FIG. 7B illustrates another band diagram of electron potential energy versus position through superlattice layers in accordance with embodiments of the present invention;

FIG. 8A illustrates another band diagram of electron potential energy versus position through superlattice layers in accordance with embodiments of the present invention;

FIG. 8B illustrates another band diagram of electron potential energy versus position through superlattice layers in accordance with embodiments of the present invention;

DETAILED DESCRIPTION

Figure 1:
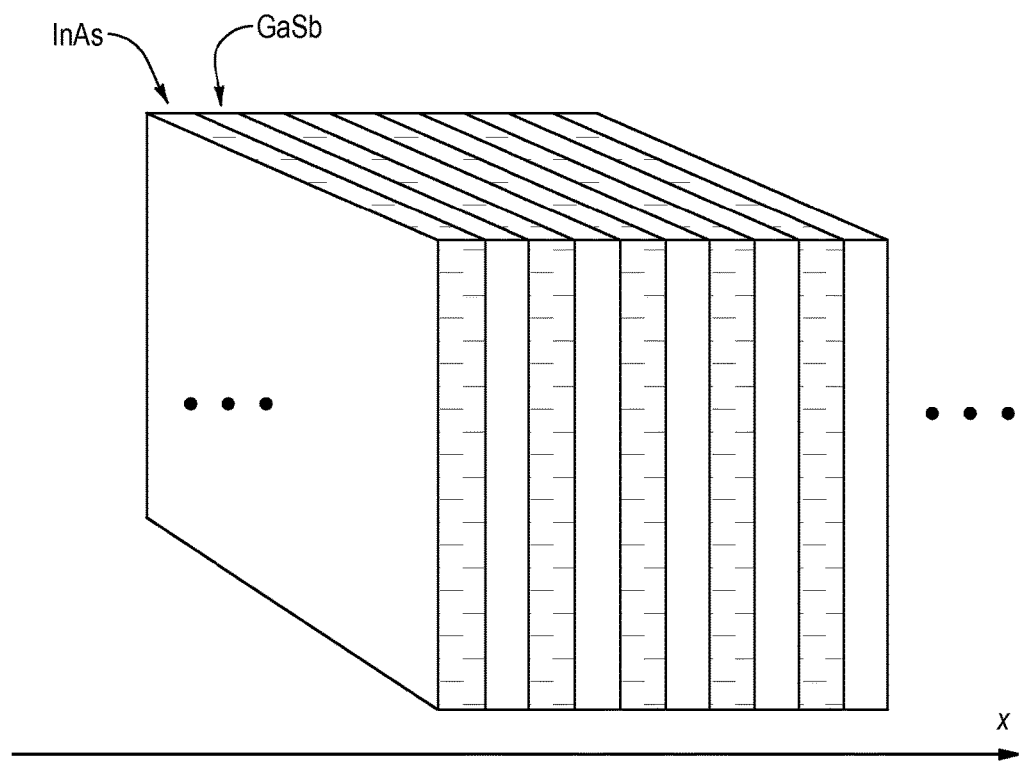
FIG. 1 illustrates a stack of semiconductor layers that form an superlattice in accordance with embodiments of the present invention.

The present invention extends to systems, methods, and apparatus configured to increase the performance of optical electric devices. In particular, embodiments of the present invention comprise structures that implement superlattice heterostructures within semiconductor optoelectronic devices. At least one embodiment comprises superlattice heterostructures in which the local material curvature of the majority carrier energy band edge is kept sufficiently small compared to the local electrostatic doping curvature, such that an adequate local majority carrier concentration is maintained for low-resistance electrical conduction. Embodiments of the present invention provide significant benefits in various applications, including improved midwave infrared ("MWIR") and long-wave infrared ("LWIR") LED performance.

In particular, embodiments of the present invention predictably produce LEDs that operate in the MWIR and LWIR wavelengths of 3 μm to 15 μm at output power levels of 0.01 mW to 100 mW. Additionally, embodiments of the present invention provide a design method for creating a desired superlattice structure without requiring the iterative adjustment of layer thicknesses and doping. Accordingly, embodiments of the present invention can create novel semiconductor heterostructures using novel design methods.

Semiconductor heterostructures made with the compounds InAs, GaSb, AlSb, and related alloys are especially useful for mid-infrared optoelectronic device fabrication. The usefulness comes from the great range of possible structures and the ensuing flexibility. Under some circumstances, these compounds are particularly well suited for bandgap engineering with superlattice heterostructures. Of course, other alloy compounds and combination of compounds may be used in the embodiments disclosed herein.

In various embodiments, superlattice bandgaps can be varied for emission and absorption wavelengths across the infrared spectrum. For some material combinations, the bandgap can be reduced to zero energy, allowing for nearly ideal tunnel junctions. This bandgap range also makes for a wide range of possible internal superlattice barriers.

Barrier control becomes increasingly important in the mid-infrared and into the far infrared wavelengths, because the smaller energy bandgaps mean that small unintentional energy barriers can have much larger relative negative impacts on the device operation. In some embodiments, the flexibility in choosing alloys and superlattice thicknesses for a given bandgap is useful for mitigating some of the challenging issues often encountered in mid-infrared optoelectronic devices. Additionally, superlattices can be engineered to reduce loss mechanisms such as Auger and Schottky-Read-Hall recombination in the active region, as well as minimizing other losses such as free carrier absorption and metal contact resistances elsewhere. This great range of possibilities has been exploited to realize LEDs, lasers, photodetectors, photovoltaic devices, as well as some versions of these devices with cascaded active regions.

Some practical problems arise, however, when using doped superlattices for device elements such as barriers, injectors, and internal contacts to tunnel junctions and other structures. For example, abruptly changing the bandgap in a doped superlattice to form an injector or junction contact can generally give an unwanted majority carrier energy bather, despite the doping.

Conventional design efforts to overcome unwanted majority carrier energy barriers typically involve beginning with an ad hoc selection of superlattice layer thicknesses and doping levels. The designer then improves the ad hoc selection by numerically calculating the energy band diagram for the structure and then iteratively adjusting the layer thicknesses and doping levels. This conventional method, however, has significant overhead and inefficiencies for designing a superlattice structure for a given purpose.

The inefficiencies discussed above are magnified when a variety of different devices are called for, such as those in a class of LEDs with different emission wavelengths. Each of these devices needs distinct designs and embodiments for their barriers, injectors, and contact superlattices. Thus the conventional ad hoc development procedure would have to be repeated for each change in bandgap or for each change in material combination used for a particular bandgap.

In contrast to conventional design methods, embodiments of the present invention provide methods for efficiently designing and implementing a wide variety of novel superlattice-based heterostructures for use as injectors, barriers, and contacts. The resulting structures are useful for fabricating superlattice-based optoelectronics devices that include LEDs, diode lasers, photodetectors, and photovoltaic devices. Such methods and structures are especially desirable for mid-infrared optoelectronic devices based upon materials related to InAs, GaSb, and AlSb, which have such a wide range of possible structures but have the great need of careful energy barrier control because of the small bandgaps. Not only would such better structures be useful for mid-infrared optoelectronic devices, they would also be desirable improvements for some ultraviolet, visible, and near-infrared optoelectronic devices implemented in other semiconductor material systems.

At least some embodiments of the methods and the structures disclosed herein utilize systematic variations in superlattice layer thickness and doping for realizing majority carrier injectors, minority carrier barriers, and majority carrier internal contacts. In particular, embodiments of the present invention can implement a local majority carrier band edge with a material curvature that is less than the local electrostatic curvature implied by the doping level at that point.

Turning now to the figures, FIG. 1 illustrates an example of a superlattice formed from InAs and GaSb semiconducting crystal layers. Representative layer thicknesses that result in the superlattice behaving as an effective medium for these materials are approximately in the range of 1 to 10 nm. In at least one embodiment of interest, the electronic states in the layers couple and disperse into a new miniband of energy, as represented in FIG. 2A for the conduction band of a uniform, periodic superlattice.

Figure 2:
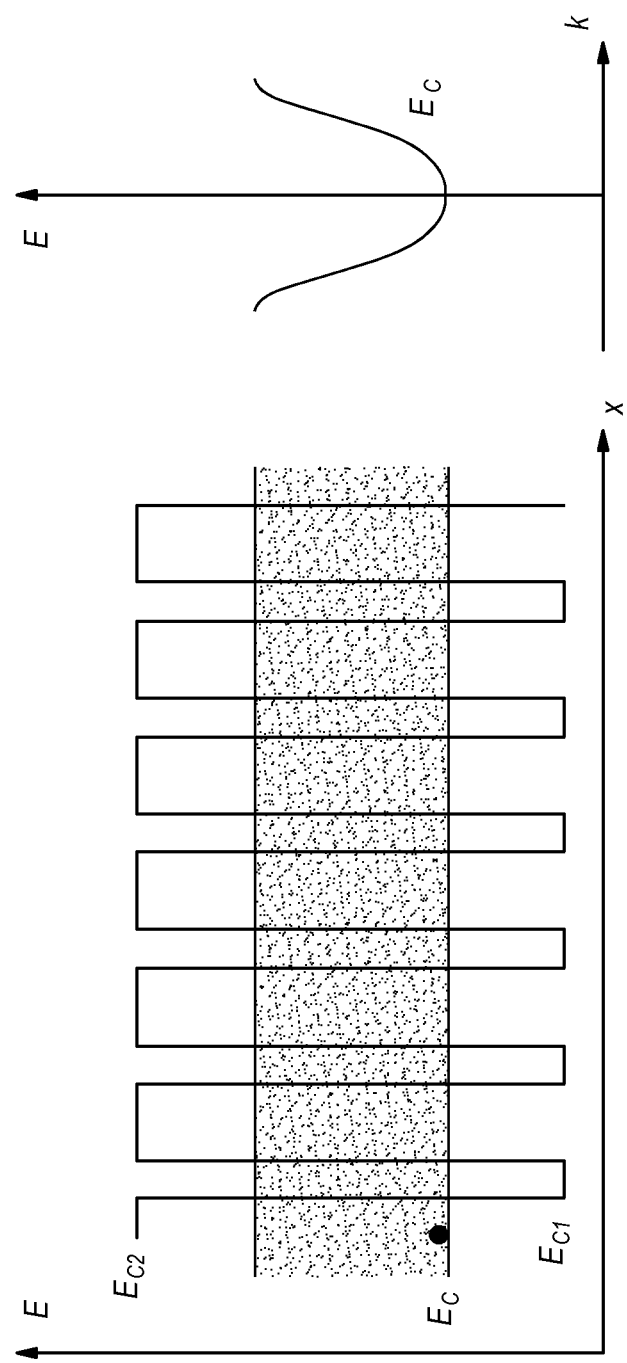
FIG. 2A illustrates a band diagram of electron potential energy versus position through superlattice layers in accordance with embodiments of the present invention.
FIG. 2B illustrates a dispersion diagram of energy versus electron wave vector in accordance with embodiments of the present invention.

FIG. 2A depicts a band diagram of electron potential energy versus position through the superlattice layers. In particular, FIG. 2A shows the conduction band edges of the two materials and the resulting superlattice miniband states. The interplay of electronic coupling through barriers and confinement to potential well layers can generate an energy miniband of conduction band states with the lowest edge of the miniband defining the effective conduction band edge $E_C$ for the composite structure.

The band diagram of FIG. 2A plots the electron potential energy E versus position in the superlattice layers x. The conduction band edges of the two constituent materials are depicted by the sequence of low and high conduction band energies $E_{C1}$ and $E_{C2}$ for the respective materials, forming energy wells and barriers. For the composite structure, the conduction band states quantum mechanically couple throughout the structure to give the gray band of energy states with the new conduction band edge $E_C$. The diagram in FIG. 2B plots the electron wave state energies E in the miniband versus the electron wave vector k.

Figure 3:
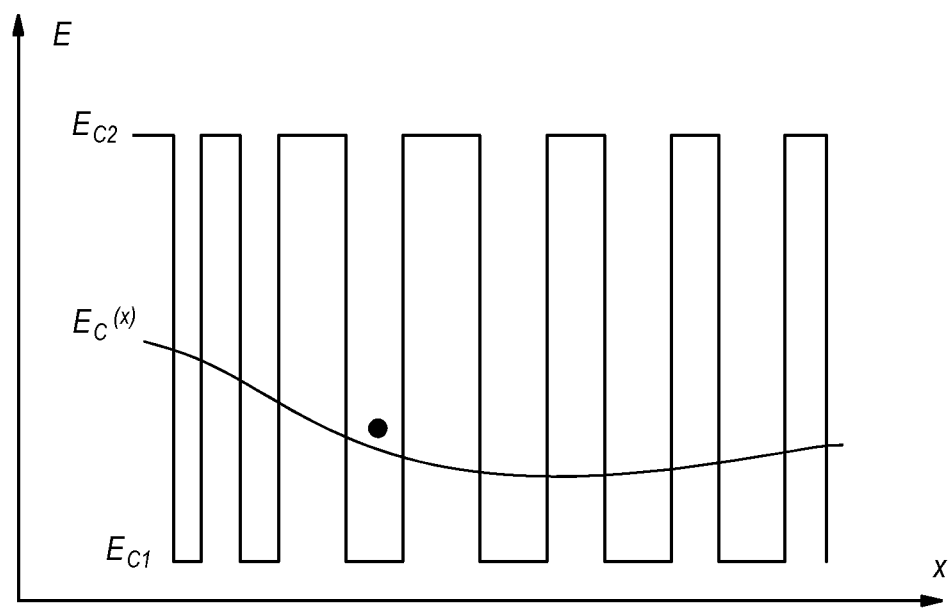
FIG. 3 illustrates another band diagram of electron potential energy versus position through superlattice layers in accordance with embodiments of the present invention.

In at least one embodiment of the present invention, slowly varying the layer thicknesses in the sequence of superlattice periods can slowly vary the corresponding miniband states within the structure. For example, the band diagram of FIG. 3 illustrates the effects on the lowest conduction band miniband edge $E_C(x)$ of a superlattice with varying layer thicknesses. In particular, the local position of the band edge depends on the interplay of quantum confinement in close-by energy wells and quantum coupling through the energy bathers between the wells.

In addition to the impact on the conduction bands, the valence band states also couple and disperse with varying layer thicknesses of the superlattice. In at least some embodiments, the resulting valence band minibands have a great deal more complexity than the conduction band minibands. Their highest energy edge, however, can be represented by the new valence band edge for the superlattice $E_V(x)$.

FIGS. 4A and 4B plot band diagrams that illustrate both the conduction band edges, $E_C(x)$, and the valence band edge, $E_V(x)$, in an InAs—GaSb superlattice with a slowly varying superlattice period. The band diagram in FIG. 4A includes the InAs and GaSb conduction band and valence edges for the individual superlattice layers as well as the miniband edges for the effective superlattice medium. At any given point in the superlattice, the new bandgap is $E_g(x) = E_C(x) - E_V(x)$. The band diagram in FIG. 4B depicts just the effective medium band edges and bandgap of the superlattice.

In at least one embodiment, the spatially-varying conduction band edge as depicted in the band diagram of FIG. 4B corresponds to an effective field an electron would experience due to material composition changes or superlattice thickness changes. Expressed as an effective electric field $\in^*_C$, often referred to as the a quasi-electric field, this material field is $$\varepsilon_C^* = \frac{1}{q}\frac{dE_C}{dx}. \tag{1}$$

A divergence in an electric field implies a charge, and by analogy a divergence in a quasi-electric field implies a quasi-charge. In the layered structures here and their one-dimensional band diagrams, an ionized and depleted impurity of concentration $N_D$, is proportional to the curvature of the conduction band edge $E_C$ with position. Correspondingly, a quasi-doping $N^*_D$ due to the material curvature of the superlattice band edge may be define as $$N_D^* = \frac{\epsilon}{q}\frac{d^2 E_C}{dx^2}, \tag{2}$$

Where $\in$ is the dielectric constant in the superlattice and q the elementary change.

Figure 5C:
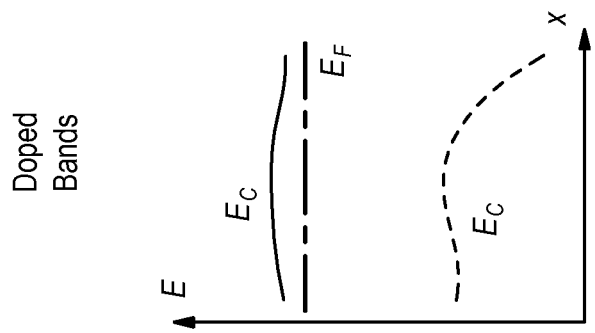
FIG. 5C illustrates a doped band diagram of electron potential energy versus position through superlattice layers in accordance with embodiments of the present invention.
Figure 5B:
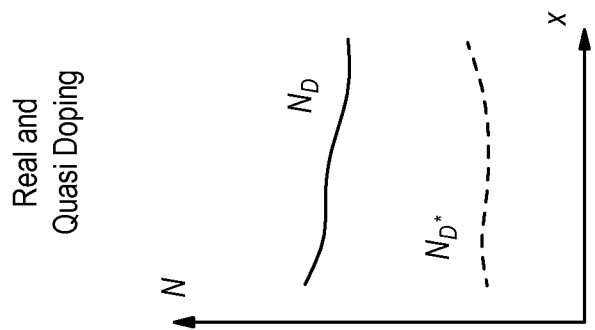
FIG. 5B illustrates a real and quasi doped band diagram of electron potential energy versus position through superlattice layers in accordance with embodiments of the present invention.
Figure 5A:
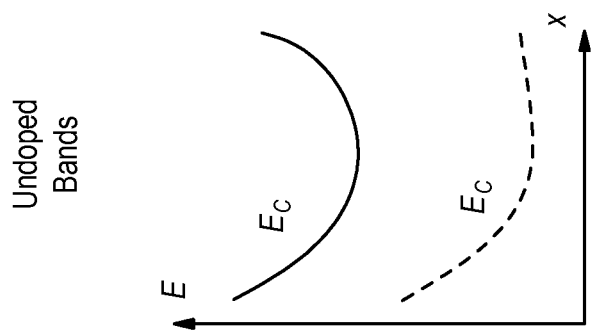
FIG. 5A illustrates an undoped band diagram of electron potential energy versus position through superlattice layers in accordance with embodiments of the present invention.

FIGS. 5A-5C illustrates an embodiment in terms of real and quasi doping levels in an n-type superlattice. The band diagram of FIG. 5A depicts the band edges of a superlattice engineered to have a conduction band edge with a minimum near the center and a larger bandgap on the right side of this region. The quasi-doping profile for this region, $N^*_D$, is plotted in FIG. 5B along with the real doping profile $N_D$.

In this example, the embodiment calls for the quasi-doping profile and the real doping profile to be jointly designed such that the real doping level is kept sufficiently above the quasi-doping level for the region to maintain the majority carrier concentration type of the dopant. The diagram depicted in FIG. 5C shows the resulting bands of the doped structure.

The majority doping with electrons ensures that the conduction band edge is pulled down to close to the Fermi level $E_F$, with the closeness determined by the difference between the real and quasi-doping profiles. With the conduction band edge pulled to the Fermi level, the valence band edge of the superlattice moves up or down to accommodate the designed bandgap of the undoped bands, with valence band energy barriers being raised or lowered to do so. In this particular illustration, a valence band barrier for holes is raised on the right side of the region.

For many superlattice barrier, injector, and internal contact designs, the embodiments disclosed herein should directly give a structure with suitable electrical properties. In several instances, though, the structure design of the embodiments disclosed herein will benefit from further refinement with numerical calculations. For example, an optimal structure may call for a minimum real doping concentration that allows a constraint on the maximum desired majority carrier barrier to be met. Alternatively, some of the detailed material properties not accounted for in the simple versions of the embodiments disclosed herein, such as variations in the effective densities of states across the superlattice or small doping-dependencies of the bandgap, may need to be evaluated numerically and the design slightly adjusted.

In many practical device fabrication circumstances, superlattice heterostructure crystals are grown with selective doping profiles that have constant values in the doped region and otherwise are undoped or doped with another impurity elsewhere. Additionally, when designing the bandgap and material curvature for a structure, simple geometric barrier shapes can facilitate specifying and evaluating the properties of the device structure. These practical desires are both met with an embodiment that employs constant doping levels and parabolic arcs for majority carrier band edges to give constant material curvatures. With the constraint of the constant material curvature, the quasi-doping level is constant, and thus this level has only to be kept sufficiently below the constant real doping level. The parabolic arcs of the energy band edges allow energy barrier heights and widths to be simply specified with the algebra of parabolas.

Turning now to FIGS. 6A-6B, the figures illustrates an embodiment of a majority electron injector with a minority hole barrier for use with an LED or laser diode implemented with a selectively-doped superlattice heterostructure. The band diagram of FIG. 6A illustrates the variation in band gap and band edges in the barrier-injector without the effects of doping. In this example, the light emission layers begin on the left-hand side of the diagram and the electron source is on the right-hand side of the diagram. The conduction band curvature has been designed with parabolic arcs with a corresponding constant curvature that gives a quasi-doping level less than the real, constant n-type donor doping level for the injector.

Additionally, the bandgap has been designed to increase in the injector, such that this increase will manifest as a barrier for the holes in the doped injector. The band diagram of FIG. 6B shows the resulting band edges with the effects of n-type doping included. In this embodiment, the Fermi level lies slightly above the conduction band edge of injector. The doping pulls the conduction band to be nearly flat, and the bandgap is consequently accommodated by pushing a hole barrier into the valence band. Keeping the quasi-doping level sufficiently below the real doping level avoids unintentional electron barriers and ensures that the n-type injector provides a low-resistance source of electrons for the light emission region. The valence band barrier for minority holes ensures good confinement of these carriers to the active layers for better light emission.

At least some embodiment of the present invention, include internal majority carrier contacts between other structures within the device. These are for connecting active regions to, for example doped bulk conduction regions, tunnel contacts, and external metal contacts.

For example, FIGS. 7A and 7B depict a superlattice majority carrier contact to a bulk conducting layer. The band diagram of FIG. 7A includes the band edges of the individual superlattice layers and omits the band-bending effects due to doping. The band diagram of FIG. 7B includes the effective medium band edges of the superlattice and includes the effects of doping.

In this example, the superlattice is composed of InAs and GaSb layers and the bulk layer is n-type GaSb, with n-type doping in the superlattice accomplished with Te. The conduction band edge of superlattice miniband has been implemented with a material curvature less than the n-type doping of the superlattice. The final band diagram shows that unintentional energy barriers in the contacting superlattice and the bulk layer have been avoided.

FIGS. 8A and 8B depict a superlattice majority carrier contact to a tunneling junction. The band diagram of FIG. 8A includes the band edges of the individual superlattice layers and omits the band-bending effects due to doping. The band diagram of FIG. 8B includes the effective medium band edges of the superlattice and includes the effects of doping. In this example the superlattice contact is composed of InAs and GaSb layers and is used to contact the n-type side of the junction. The p-type side of the tunneling junction is a GaSb layer.

In at least one embodiment, the conduction band edge of superlattice miniband has been implemented with a material curvature less than the n-type doping of the superlattice. FIG. 8B shows that unintentional energy barriers in the contacting superlattice have been avoided. In this example, the doping on both sides of the tunneling junction is accomplished with Si impurities. The Si behaves as a p-type dopant in the GaSb and as an n-type dopant in the InAs. Therefore doping the InAs superlattice layers on the n-type with Si and the GaSb layers on the p-type side of the tunnel junction gives the proper doping profile.

Figure 9:
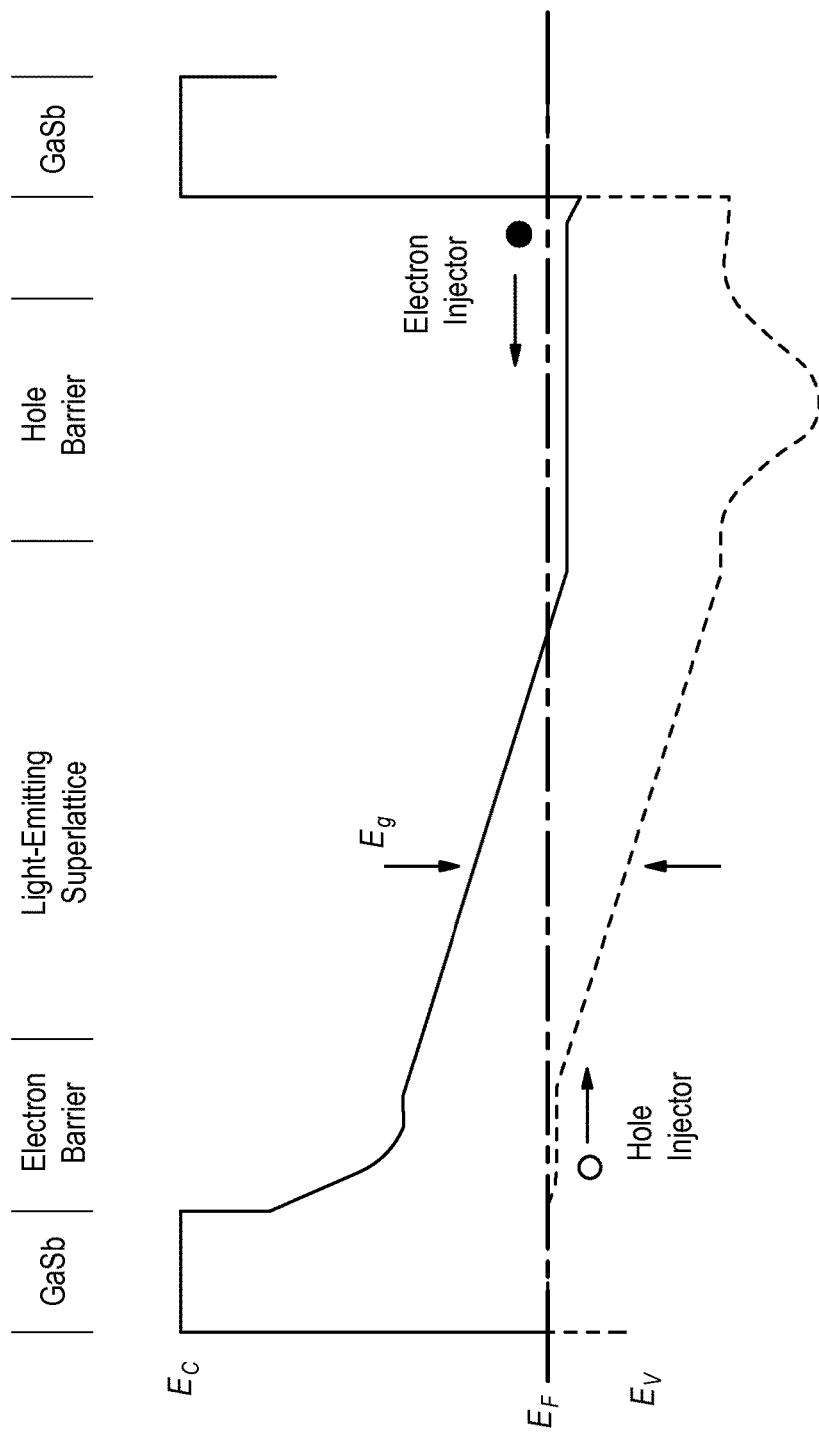
FIG. 9 illustrates another band diagram of electron potential energy versus position through superlattice layers in accordance with embodiments of the present invention.

FIG. 9 shows the band diagram for an embodiment of a mid-infrared superlattice LED implemented with InAs—GaSb superlattice heterostructures for electron and hole injectors and for minority carrier confinement barriers. Majority carrier contact superlattices also connect the hole and electron injectors to the respective hole and electron sources. The band diagram shows the conduction and valence band edges of the superlattice bands and a flat Fermi level corresponding to no applied potential. This emission stage incorporates several particular embodiments of the general embodiment given in FIGS. 5A-5C.

Holes are injected into the light emitting superlattice from the left by an embodiment that forms a hole injector in the valence band and a minority electron barrier in the conduction band. The hole injector also includes an embodiment that forms a low-resistance electrical contact to p-type GaSb, which supplies the holes.

The electron injector may comprise the structure depicted in FIGS. 6A-6B. Electrons are injected into the light emitting superlattice from the right by an embodiment which forms an electron injector in the conduction band and a minority hole barrier in the valence band. The electron injector is connected with an embodiment that uses an n-type graded superlattice to electrically connect the injector with an embodiment of a band-to-band tunneling contact, similar to the embodiment of FIGS. 8A-8B, which supplies the electrons.

Figure 10B:
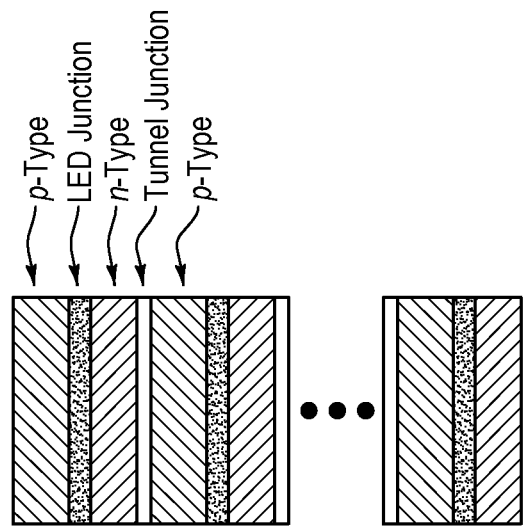
FIG. 10B depicts a representative image of superlattice layers in accordance with embodiments of the present invention.
Figure 10A:
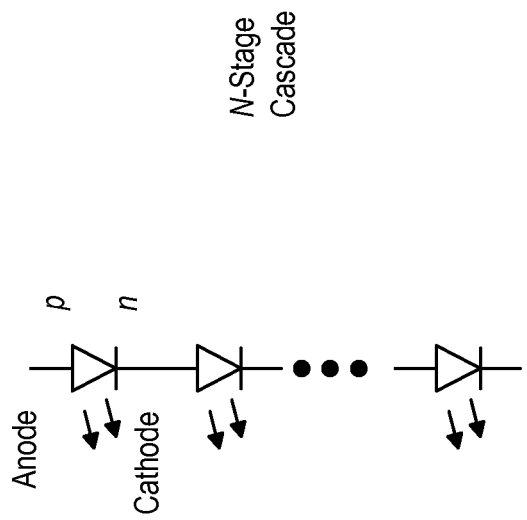
FIG. 10A depicts a circuit diagram in accordance with embodiments of the present invention.
Figure 11:
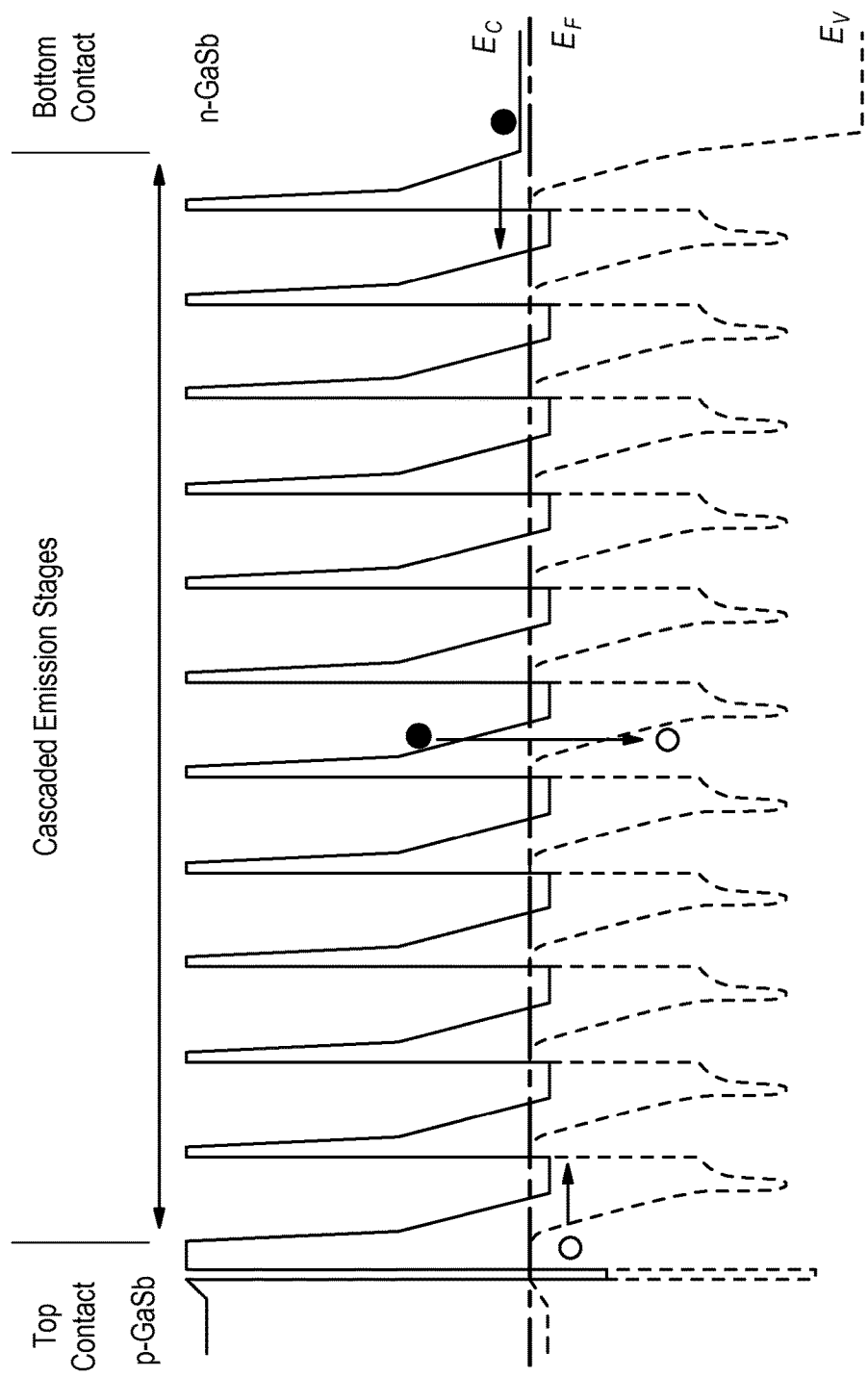
FIG. 11 illustrates another band diagram of electron potential energy versus position through superlattice layers in accordance with embodiments of the present invention.

FIGS. 10A and 10B give two representations of a cascaded LED with N cascaded emission stages, displaying an equivalent circuit diagram for the cascade of light emitting pn-diode junctions. The doped superlattice heterostructures of the embodiments disclosed herein are depicted in the band diagram of FIG. 11, which shows 12 cascaded LED junctions. This example embodiment is implemented with InAs—GaSb superlattice heterostructures for light emission, confinement, contacting and tunneling. Electron flow is to the left from the n-type GaSb on the right through the cascade, and the hole flow is to the right from the p-type GaSb on the left.

This cascaded LED embodiment can include several structures implemented with the doped, graded superlattice heterostructures of the embodiments disclosed in FIGS. 5A-5C. Beginning at the n-GaSb substrate on the right, an embodiment similar to the superlattice bulk contact of FIGS. 7A and 7B electrically connects the first emission stage superlattice conduction band to the bulk n-GaSb and provide minority carrier hole confinement to the first light emission structure. The first stage then incorporates an embodiment for an internal contact to the p-side of the first tunnel junction and also realizes the hole injector and minority electron confinement barrier for the first stage. The remaining 11 stages incorporate this same p-contact, hole-injector, electron barrier structure. The remaining 11 stages all embody the mid-infrared LED emission stage of FIG. 9, which in turn includes embodiments of the tunnel junction contact superlattice of FIGS. 8A and 8B and the superlattice electron injector and hole barrier of FIGS. 6A and 6B.

Accordingly, embodiments of the present invention can create and comprise superlattice heterostructure barriers, injectors, and internal contacts of the embodiments disclosed herein with improved emission stages and cascaded LED stages fabricated in materials such as GaN, AlN, InN, and their alloys for visible and ultraviolet LEDs.

Figure 12:
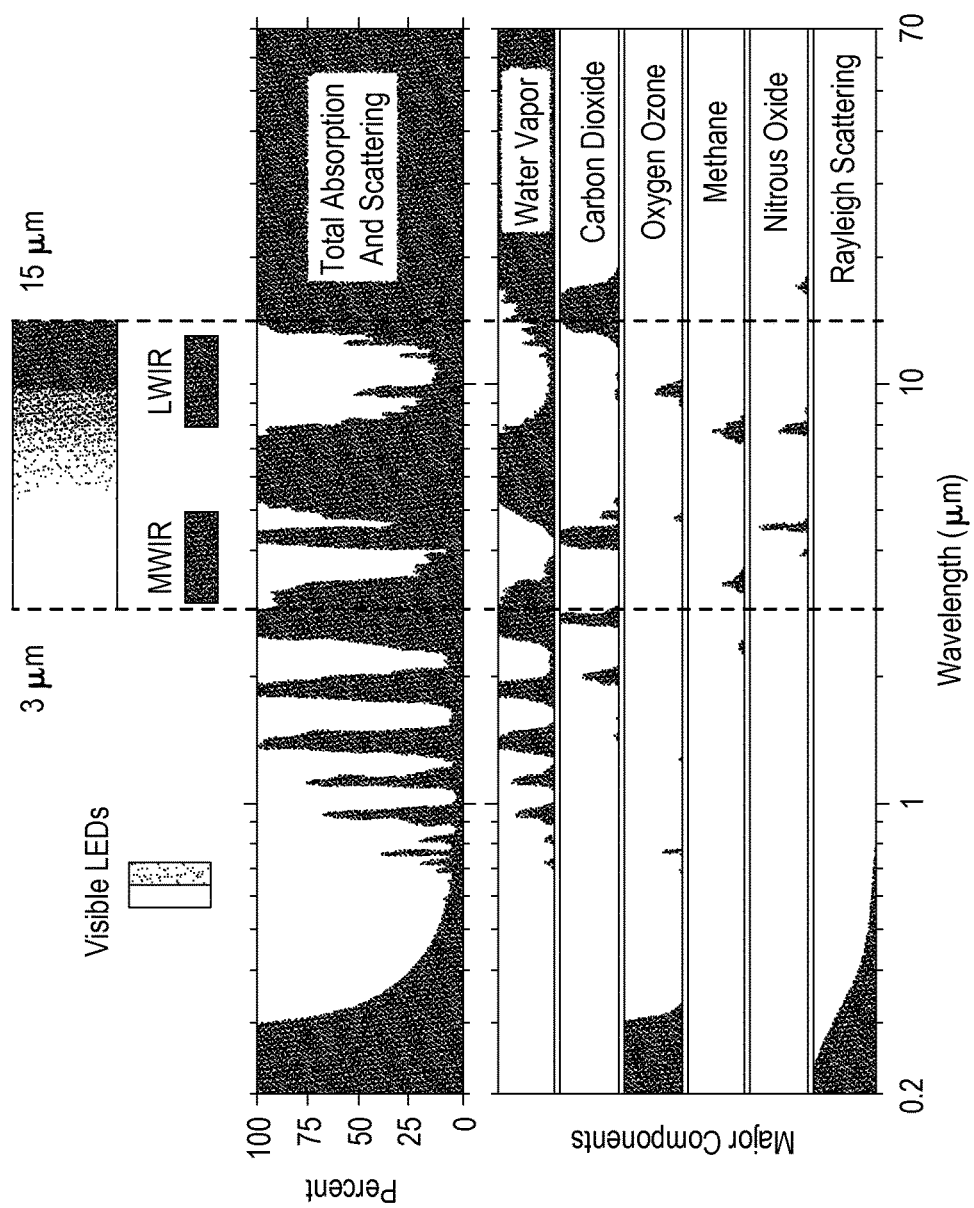
FIG. 12 depicts a MWIR and LWIR spectrum in conjunction with absorption and scattering components in accordance with embodiments of the present invention.

For example, FIG. 12 depicts a MWIR and LWIR spectrum in conjunction with absorption and scattering components in accordance with embodiments of the present invention. In at least one embodiment of the present invention, an LED can be created that generates light in wavelengths between 3 µm to 15 µm at output power levels of 0.01 mW to 100 mW, in wavelengths between 4 µm to 5 µm at output power levels of greater than 1 mW, or at a wavelength of 4.25 µm at output power level of greater than 1 mW.

The absorption and scattering components depicted in FIG. 12 indicate components that scatter or absorb MWIR and LWIR. As such, embodiments of the present invention can detect the presence of one or more of the components by detecting the absorption and scattering of light generated by MWIR and LWIR LEDs. For example, an LED operating as a wavelength of 4.25 µm can be used to detect the presence of carbon dioxide.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectric device, comprising:
   a semiconductor superlattice heterostructure, wherein one or more individual layers within the semiconductor superlattice heterostructure comprise layers of differing thicknesses; and
   wherein, the optoelectric device generates an output wavelength of between 3 µm to 15 µm at output power levels of 0.01 mW to 100 mW.

2. The device of claim 1, wherein the optoelectric device generates an output wavelength of between 4 µm to 5 µm at output power levels of greater than 1 mW.

3. The device of claim 2, wherein the optoelectric device generates an output wavelength of 4.25 µm at output power level of greater than 1 mW.

4. The device of claim 1, further comprising a detector that is configured to detect the output wavelength of the optoelectric device and based upon the detected output wavelength identify the presence of carbon dioxide.

5. The device of claim 1, wherein the semiconductor superlattice heterostructure simultaneously comprises varying local superlattice periods and majority carrier doping levels which removes energy bathers to majority carrier flow while imposing a barrier to minority carrier flow.

6. The device of claim 1, wherein when electrons are majority carriers, a superlattice conduction band edge of the semiconductor superlattice heterostructure varies smoothly.

7. The device of claim 6, wherein when holes are the majority carriers, the superlattice valence band edge varies smoothly.

8. The device of claim 1, wherein a spatial curvature of a local energy band edge for majority carriers due to the layers of differing thicknesses is kept less than an electrostatic curvature corresponding to local dopants being fully ionized.

9. The device of claim 8, wherein a barrier for minority carriers increases both from electrostatic effects due to majority carrier doping and from a reduced quantum-mechanical resonance of minority carrier miniband states.

10. The device of claim 1, wherein one or more superlattice heterostructure barriers are engineered by parabolically varying an effective energy band edge with position through the superlattice layers for majority carriers while keeping a local doping level constant.

11. A method of manufacturing semiconductor superlattice heterostructures, the method comprising:
   creating a semiconductor superlattice heterostructure by alternating layers of semiconducting crystals, wherein:
      each layer comprises a thickness of between 1 to 10 nm; and
      the layers of semiconducting crystals comprises a variable, graded period, such that one or more of the alternating layers comprise a different thickness; and
   configuring the semiconductor superlattice heterostructure to simultaneously remove energy barriers to majority carrier flow while imposing a barrier to minority carrier flow by varying the layer period and a majority carrier doping level.

12. The method of claim 11, further comprising:
   creating an optoelectric device that when powered generates an output wavelength of between 3 µm to 15 µm at output power levels of 0.01 mW to 100 mW.

13. The method of claim 12, wherein the optoelectric device generates an output wavelength of between 4 µm to 5 µm at output power levels of greater than 1 mW.

14. The method of claim 13, wherein the optoelectric device generates an output wavelength of 4.25 µm at output power level of greater than 1 mW.

15. The method of claim 11, further comprising:
   configuring the semiconductor superlattice heterostructure to provide majority carrier electrical contacts to band-to-band tunneling junctions.

16. The method of claim 11, further comprising:
   configuring the semiconductor superlattice heterostructure to implement majority carrier injectors and minority carrier barriers for diode lasers.

17. The method of claim 11, further comprising:
configuring the semiconductor superlattice heterostructure to implement superlattice barriers for semiconductor photodetectors.

18. The method of claim 11, further comprising:
configuring the semiconductor superlattice heterostructure to engineer superlattice barriers for photovoltaic devices.

19. An optoelectric device, comprising:
a semiconductor superlattice heterostructure, wherein one or more individual layers within the semiconductor superlattice heterostructure comprise layers of differing thicknesses;
hole injectors that connect a valence band edge of a tunneling contact via a p-type GaSb layer for majority hole carriers to light emitting superlattice layers while providing a minority electron blocking barrier;
electron injectors that connect a conduction band edge of a tunneling contact for majority electron carriers to the light emitting superlattice layers while providing a minority hole blocking layer; and
wherein, the optoelectric device is configured to construct majority carrier injectors and minority carrier barriers for mid-infrared LEDs using InAs and GaAs and related compounds for superlattices for light emission.

20. The device of claim 19, wherein the optoelectric device generates an output wavelength of 4.25 µm at output power level of greater than 1 µW.

\* \* \* \* \*